us007304684B2

United States Patent
Segawa et al.

(10) Patent No.: US 7,304,684 B2
(45) Date of Patent: Dec. 4, 2007

(54) IMAGE PICKUP APPARATUS, METHOD OF MAKING, AND ELECTRIC APPARATUS HAVING IMAGE PICKUP APPARATUS

(75) Inventors: Masao Segawa, Fujisawa (JP); Michiko Ooishi, Kawasaki (JP); Jun Karasawa, Tokyo (JP); Tomoyuki Sasaki, Inagi (JP); Jun Asaga, Sawa-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 698 days.

(21) Appl. No.: 09/986,909

(22) Filed: Nov. 13, 2001

(65) Prior Publication Data

US 2002/0057468 A1    May 16, 2002

(30) Foreign Application Priority Data

Nov. 14, 2000    (JP)    ............................ 2000-346564

(51) Int. Cl.
    *H04N 5/225* (2006.01)
(52) U.S. Cl. ...................................................... 348/374
(58) Field of Classification Search ................ 348/374, 348/375
    See application file for complete search history.

(56) References Cited

U.S. PATENT DOCUMENTS

| 5,130,804 A | * | 7/1992 | Tamura et al. ............ 348/231.7 |
| 5,153,734 A | * | 10/1992 | Kanamori et al. .......... 348/340 |
| 5,191,224 A | * | 3/1993 | Tazunoki et al. ........... 257/724 |
| 5,861,654 A | * | 1/1999 | Johnson ...................... 257/433 |
| 2002/0044215 A1 | * | 4/2002 | Takagi et al. ............... 348/374 |
| 2003/0025824 A1 | * | 2/2003 | Ishikawa .................... 348/374 |
| 2003/0137595 A1 | * | 7/2003 | Takachi ...................... 348/340 |

FOREIGN PATENT DOCUMENTS

| JP | 05-275201 | * 10/1993 |
| JP | 7-99214 | 4/1995 |
| JP | 8-148666 | 6/1996 |
| JP | 2000-69336 | 3/2000 |
| JP | 2001-188155 | 7/2001 |

\* cited by examiner

*Primary Examiner*—Vivek Srivastava
*Assistant Examiner*—Anthony J. Daniels
(74) *Attorney, Agent, or Firm*—Oblon, Spivak, McClelland, Maier & Neustadt, P.C.

(57) ABSTRACT

An image pickup apparatus includes a first connector arranged on a wiring board, a second connector including an optical lens and being engageable with the first connector, and a photoelectric conversion module on which light is incident from the optical lens, the photoelectric conversion module being fixedly held when the photoelectric conversion module is clamped by the first and second connectors in a state where the first and second connectors are in engagement and coupled relatively to each other.

12 Claims, 9 Drawing Sheets

IMAGE PICKUP APPARATUS, METHOD OF MAKING, AND ELECTRIC APPARATUS HAVING IMAGE PICKUP APPARATUS

CROSS-REFERENCE TO RELATED APPLICATIONS

This application is based upon and claims the benefit of priority from the prior Japanese Patent Application No. 2000-346564, filed Nov. 14, 2000, the entire contents of which are incorporated herein by reference.

BACKGROUND OF THE INVENTION

1. Field of the Invention

The present invention relates to an image pickup apparatus capable of realizing a small and thin size and a light weight, and a method of manufacturing the same, and a portable apparatus in which the image pickup apparatus is incorporated.

2. Description of the Related Art

The image pickup apparatus incorporated in a portable apparatus such as a digital camera or the like is required to have a small and thin size and a light weight and is also required to reduce material costs and manufacturing costs. Meanwhile, Jpn. Pat. Appln. KOKAI publication No. 7-99214 discloses an example of a method of manufacturing a photoelectric conversion module incorporated in the image pickup apparatus.

In the photoelectric conversion module described in the above-mentioned Jpn. Pat. Apln. Publication No. 7-99214, the photoelectric conversion module is installed on the module board by soldering or thermocompression bonding using an anisotropic conductive adhesive agent (paste or sheet).

As shown in FIG. 14, to connect external terminals of a photoelectric conversion module 300, the back surface of a module substrate 321 must be fixed to the upper sides of the heating stages 330a and 330b and also must be soldered thereto by heating bonding tools 331a and 331b such as pulse heats or the like, for about 30 seconds or the like.

Therefore, a space of about 2 to 5 mm equivalent to the lead length of external terminals 335a and 335b where assembly is actually impossible appears on the back surface of the module substrate 321. Chip components or the like (not shown) forming part of a camera module must be mounted in the outside thereof, thereby limiting the downsizing.

Also, a soldering time of several ten seconds is required and causes difficulties in improvement of production ability. In addition, a micro lens is provided on the surface of the image sensor. In this case, heating by a thermocompression bonding tool or a reflow furnace, from the viewpoint of maintaining optical characteristics.

BRIEF SUMMARY OF THE INVENTION

The present invention has an object of providing an image pickup apparatus which achieves high productivity and can be down-sized.

According to an aspect of the present invention, there is provided an image pickup apparatus comprising: a wiring board on which electronic components are assembled; a lens holder which holds an optical lens; and a module board which is provided between the wiring board and the lens holder and on which a photoelectric conversion element (introduced by the optical lens) is mounted, wherein an engaging part and an electrode part are provided on a surface of the wiring board in a side of the module board, an external connection terminal opposed to the electrode part and connected to a terminal of the photoelectric conversion element are provided on the surface of the wiring board in a side of the module board, and the lens holder is provided with an engaged part which is to be engaged with the engaging part, and a press part which presses the external connection terminal against the electrode part.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
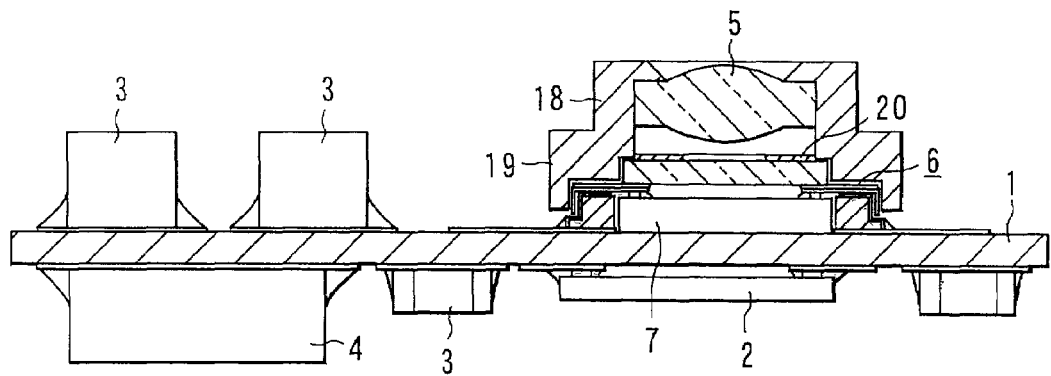
FIG. 1 is a cross-sectional view showing a camera module according to a first embodiment of the present invention.

FIG. 1 is a cross-sectional view showing the structure of a camera module integrated with a lens, which is incorporated in an image pickup apparatus according to the first embodiment. In one side (back surface side) of the module substrate 1 comprising a double-sided wiring board, a signal processing IC (DSP) 2 is banded by flip-chip assembly, and chip components 3 and a connector 4 for connection to a main board not shown are mounted by soldering.

Meanwhile, in the other side (front surface side) of the module board 1, chip components 3 are mounted by soldering, and a photoelectric conversion module 6 incorporating an optical lens 5 is assembled.

Figure 2:
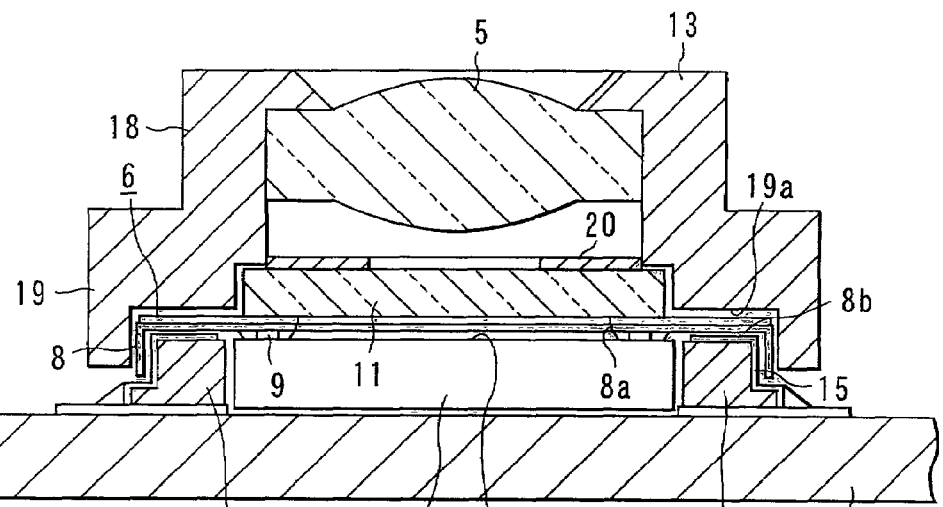
FIG. 2 is a cross-sectional view of a main part of a camera module.

FIG. 2 is a cross-sectional view of a main part of a camera module. The photoelectric conversion module 6 has a flexible board 8, the bare chip of a photoelectric conversion element 7, and an optical glass plate 11. The bear chip may be a CCD (Charge Coupled Device), a CMOS sensor, or the like. This bare chip is applied to flip chip interconnection method, and bonded to the surface of a flexible board 8 through a bump 9 using anisotropic conductive paste.

The flexible board 8 is a board having a thickness of about several ten to several hundred μm and made of insulating material, for example, polyimide, polyester, liquid crystal polymer, or the like. In addition, total 30 external connection terminals of the flexible board 8 are arranged in two parallel rows at a pitch of about 0.5 mm. The optical glass plate 11 is fixed to the other surface of the flexible board 8 with an adhesive agent and opposes the photoelectric conversion element 7. The adhesive agent may be of the type that hardens when set in a normal-temperature atmosphere or when applied with light. A non-flexible board may replace the flexible board 8, provided that if is compatible with connectors.

An opening part 8a is formed at least at a part of the area of the flexible board 8 that is sandwiched between the optical glass plate 11 and the photoelectric conversion element 7 of the photoelectric conversion module 6. The photoelectric conversion part 7a of the photoelectric conversion element 7 is arranged so as to face this opening 8a. The optical glass plate 11 is fixed to the surface of the flexible board 8, which faces away from the photoelectric conversion element 7. The glass plate 11 closes the opening 8a. A thin film formed of a single layer or stacked layers is provided on the surface of the glass plate 11, to prevent refection or provide an optical filter. Thus, the thin film imparts desired optical characteristics to the glass plate 11.

A photoelectric conversion module 6 which thus comprises the photoelectric conversion element 7, the flexible board 8, and the optical glass 11 formed without using soldering material can be assembled without adding much heat to the photoelectric conversion element 7. Note that it is possible to use ultra sonic flip chip bonding or junction based on photosensitive resin.

At the part of the module board 1, which surrounds the photoelectric conversion element 7, a connector (first connector) 12 of surface-mount type is mechanically fixed to the electrodes provided on the module board 1 by soldering based on reflow. Spring electrodes 15 which the connector 12 has are electrically connected to electrodes at the surface of the module board 1 by soldering and is pressed into contact with the external connection terminal 8b which the flexible board 8 has at the spring part, thereby to attain electric connection is attained.

A lens holder 13 holds a lens 5. The lens holder 13 is a hollow cylinder that serves as a lens-barrel 18 for the lens 5. The lower end of the lens holder 13 in the figure forms a socket 19 and is engaged with the connector 12, as will be described later. The opening of the socket 19 is provided on the extended line of the optical axis of the lens 5.

The opening of the socket 19 is engaged with the connector 12 through an area of the flexible board 8 including the external connection terminals of the flexible board 8. By this engagement, the flexible board 8 is deformed along the outer shape of the connector 12. The socket 19 has a pressing part 19a. The pressing part 19a presses the connection terminal 8b of the flexible board 8 against the spring electrodes 15 of the connector 12. The terminal 8b is thereby firmly connected to the electrodes 15. This ensures electrical conduction between the board 8 and the connector 12.

The spring electrodes 15 are biased in the direction opposite to the direction in which the pressing part 19a exerts a force. The socket 19 and the connector 12 therefore remain in electrical connection.

The optical glass 11 is included in the socket part 19. The optical glass 11 is let collide with the inner wall of the socket 19, to position the lens 5 and the photoelectric conversion element 7 at the optical distance in the optical axis direction. The socket 19 incorporates a diaphragm 20. The diaphragm 20 has an opening and covers a part of the optical glass plate 11.

The lens holder 13 engaged with the connector 12 fixes and maintains the lens 5. Further, the lens holder 13 mechanically fixes the lens 5 so as to oppose to the photoelectric conversion element 7 and simultaneously presses the external connection terminal 8b of the flexible board 8 and the electrode pattern of the module board 1 into contact with each other through the spring electrodes 15, thereby electrically connecting the flexible board 8 to the module board 1.

The incidence end of the lens 5 may need to be used together with a diaphragm. If this is the case, the lens holder 13 is designed to function as a diaphragm. That is, that open end that the incidence surface of the lens 5 opposes is used as a diaphragm.

A bump 9 for connection, which is formed on the electrode pad of the photoelectric conversion element 7, is a sphere made of Au and having a diameter of about several ten to hundred and several ten μm. For example, the bump 9 is provided by electric plating, a wire bonding method, a transfer method, or the like. For example, a glass epoxy wiring board (FR-4) subjected to multi-layer wiring of four layers, a ceramic board, a glass wiring board, or the like can be used for the module board 1.

Next, a method of manufacturing the camera module shown in FIG. 1 will be explained with reference to FIGS. 3A to 3D.

Figure 3A:
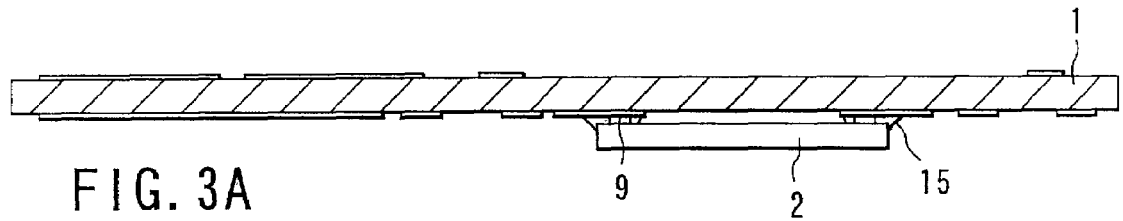
FIGS. 3A to 3D are views showing steps of a method of manufacturing the camera module shown in the first embodiment.

As shown in FIG. 3A, a signal processing IC 2 (DSP) or the like is previously flip chip-connected to the back side of the module board 1 through an anisotropic conductive adhesive film 15. A bump 9 is previously formed on the electrode of the signal processing IC 2. The anisotropic conductive adhesive film 15 can be provided by pattern-applying a paste-like material by a dispense method, a screen print method, or the like, or by adhering a sheet-like material thereto. This anisotropic conductive film 15 is thermosetting epoxy resin. The surface where the bump 9 is provided is pressed against the anisotropic conductive film 15, to achieve thermocompression bonding (for about 10 seconds at 200° C.). In this manner, the electrodes of the signal processing IC 2 and the module board 1 are connected by the bump 9, to obtain electric connection.

Figure 3B:
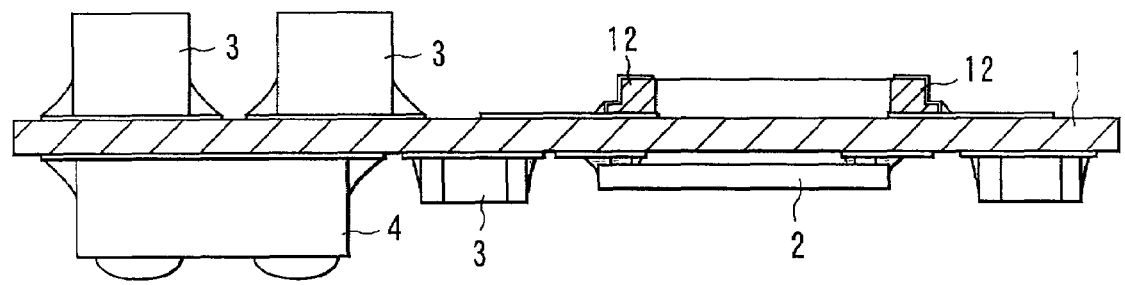

Next, as shown in FIG. 3B, the chip component 3 and the connector 4 are mounted on the front and back surfaces of the module board 1, respectively, by reflow soldering or the like. At this time, the connector 12 is also reflow-soldered to the module board 1, simultaneously with the chip component 3.

Figure 3C:
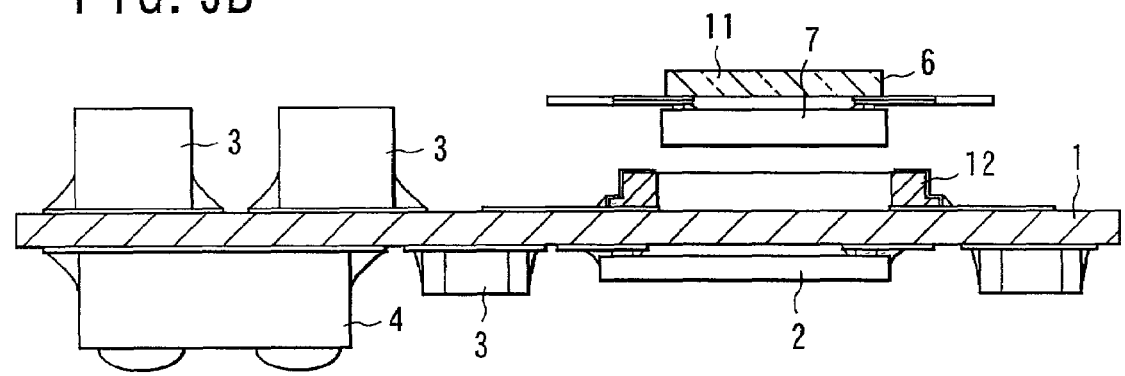

As shown in FIG. 3C, the external connection terminal 8b of the flexible board 8 is positioned on the connector 12, so as to correspond to the spring electrodes 15.

Figure 3D:
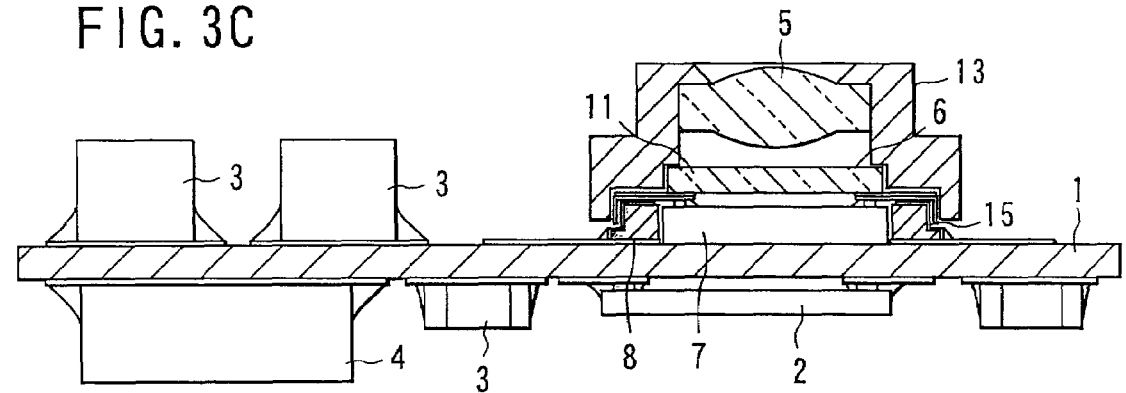

As shown in FIG. 3D, the socket 19 of the lens holder 13 is forced into the connector 12 through the flexible board 8. At this time, the external connection terminal 8b of the flexible board 8 is pressed against the side of the spring electrodes 15 of the connector 12, and the elastic force of the spring electrodes 15 acts against the pressing force, thereby to electrically connect the external connection terminal 8b and the spring electrodes 15 to each other.

At this time, the inside of the lens holder 13 is let contact the surface of the optical glass 11 of the photoelectric conversion module 6, so that the lens 5 and the photoelectric conversion element 7 are opposed to each other while an optical distance therebetween is maintained at a predetermined value.

The external terminal of the flexible board 8 may be previously bent in accordance with the shape of the connector 12, when it is mounted on the module board 1. Alternatively, it may be bent by the lens holder 13 when the lens holder 13 is engaged with the connector. In addition, the terminal may be attached to the connector 12 after previously adhering the flexible board 8 to the lens holder 13 with use of an adhesive agent.

According to the image pickup apparatus according to the present embodiment, the photoelectric conversion element 7 can be electrically connected very easily in a short time to the module board 1 to which the optical system having the lens 5, the chip component, and the like are reflow-connected, by mechanical press-contact based on the socket part 19 of the lens holder 13 and the spring electrodes 15 of the connector 12. Therefore, camera modules each having a small size can be provided with high yield.

The photoelectric module 6 does not need to be laid on the back of the module board 1 as the conventional module. This is because the connector 12 has been incorporated into the module 6 before the module 6 is amounted on the module board 1. Additionally, the components of the module 6 can be freely arranged, which renders the module 6 small.

The photoelectric module 6 is laid on the module board 1 after the re-flow step has been performed on the board 1. It is therefore unnecessary to apply excessive heat to the optical glass plate 11. This helps to enhance the yield of the camera module.

The connector 12 uses plastic material such as polypropylene or the like as base material, and the spring electrodes 15 have a thickness of about 0.1 to 0.3 mm and are made of phosphor bronze or beryllia copper. The surface thereof is subjected to plating processing with nickel and gold, to reduce the contact resistance. In addition, the contact pressure at which the spring electrodes 15 contacts the external terminal of the photoelectric conversion module 6 is designed to be about 40 to 100 gf/pin.

The connector 12 has a frame-like shape. The height of the lens can be minimized by adjusting the back side of the photoelectric conversion element 7 so as to contact the module board 1.

Figure 4:
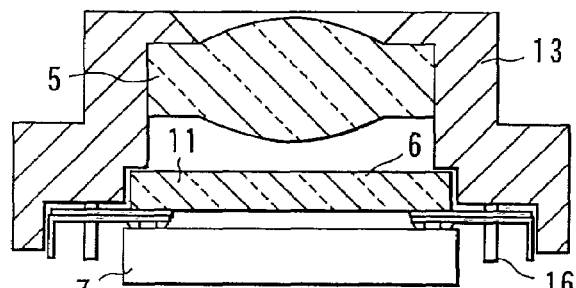
FIG. 4 is an explanatory view of a modification of connector engagement.
Figure 4:
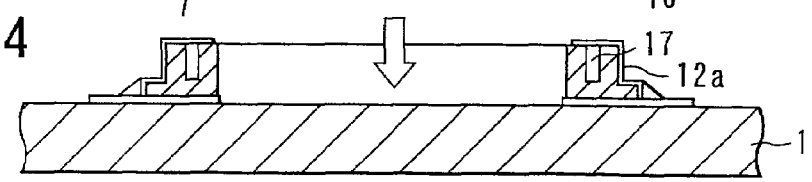

FIG. 4 is a view showing a modification of the present embodiment of the present embodiment. In a camera module according to the present modification, fixture, optical positioning, and electric connection of the lens holder 13 can be ensured with high precision, by providing a pin 16 and an opening part 17 engaged with the pin, for the socket part 19 and the connector 12 of the lens holder 13.

The flexible board 8 may have a hole that allows passage of the pint 16. In this case, the optical axis of the lens holder 13 can be aligned with that of the connector 12, without any positional adjustment of the lens holder 13 or the connector 12.

Figure 5:
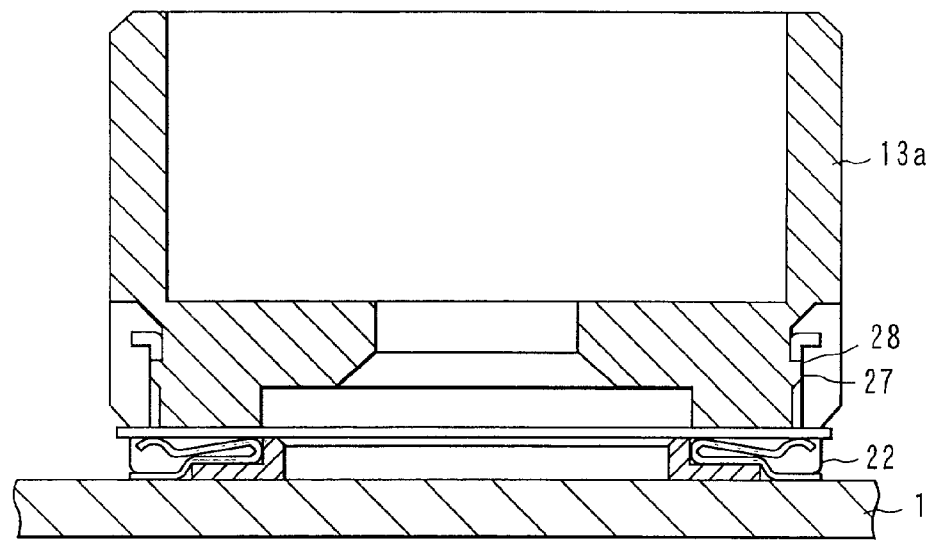
FIG. 5 is a cross-sectional view showing a modification of a method of fixing a connector and a lens holder.
Figure 6:
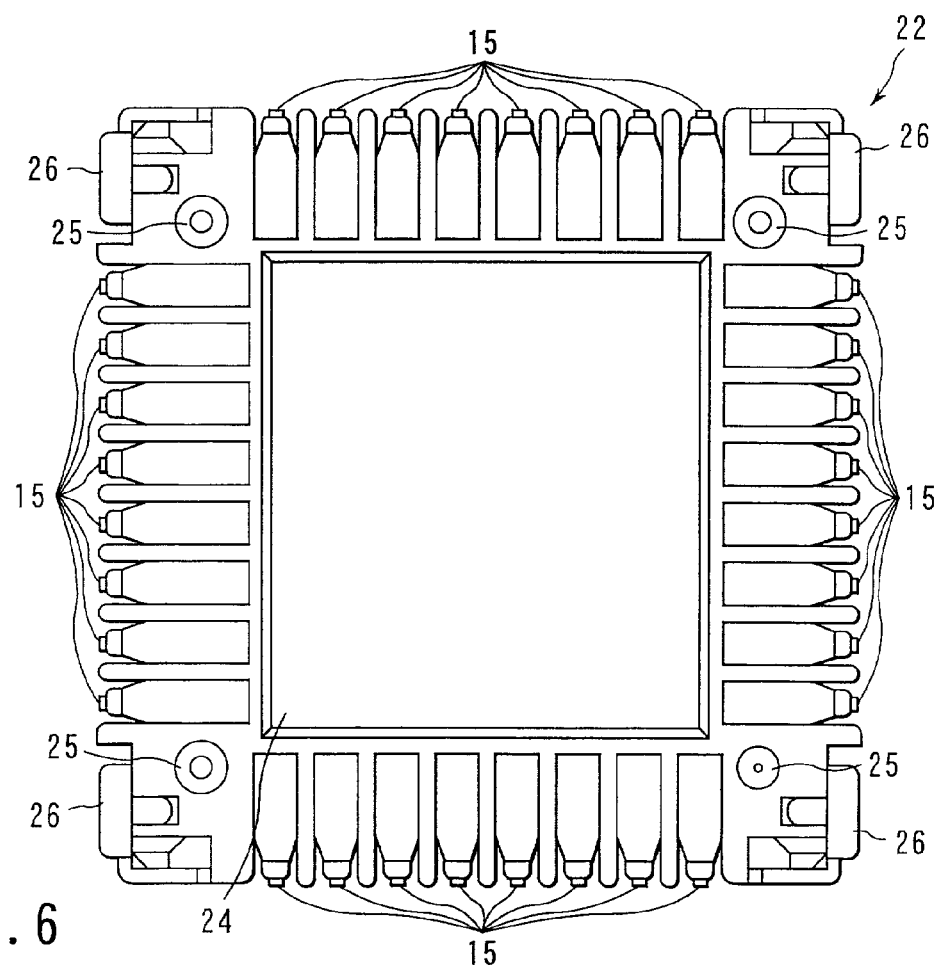
FIG. 6 is a plan view of a connector.

FIGS. 5 and 6 are views showing another modification of the present embodiment. FIG. 5 is a cross-sectional view showing a modification of a method of fixing a connector 22 and a lens holder 13a. In a camera module according to the present modification, the connector 22 is formed in a frame-like shape in which an opening part 24 where a photoelectric conversion element 7 is inserted is provided at the center. Spring electrodes 15 which are deformed in the thickness direction (in the vertical direction in FIG. 5) are provided in parallel respectively at four edge parts.

In addition, a positioning boss 25 and a fixing spring 26 are provided so as to stand at each of four corner parts of the frame-like part. Of the four positioning bosses 25, only one has a different diameter the other bosses. It is possible to engage them with the connector 22 only in case where the direction of the lens holder 13a is in a predetermined direction.

The fixing springs 26 are respectively provided with engaging holes 27. Projections 28 formed on the lens holder 13a are engaged in these engaging holes 27, so that the lens holder 13a is fixed at predetermined positioning precision.

Figure 7A:
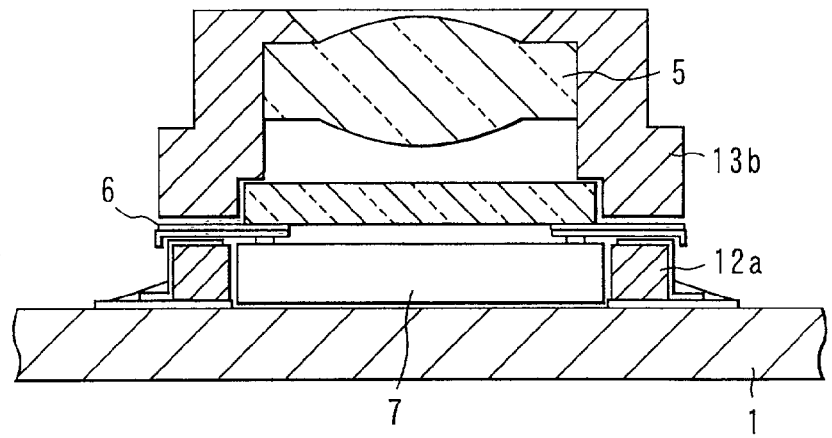
FIGS. 7A and 7B are side views showing a modification of the first embodiment.
Figure 7B:
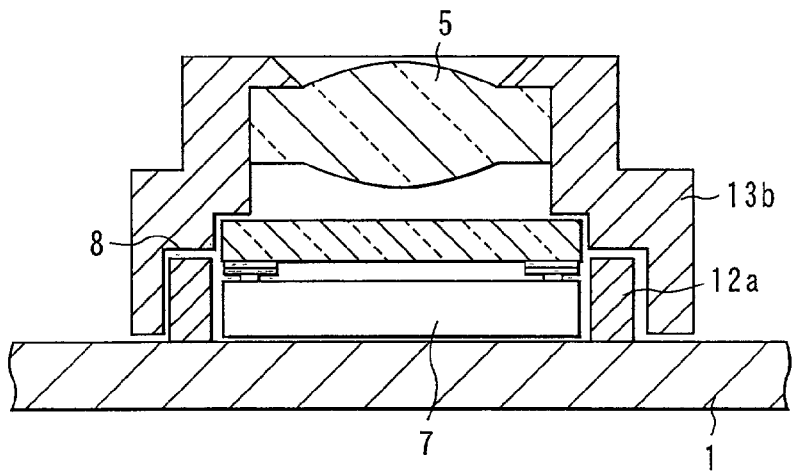

FIGS. 7A and 7B shows further another modification of the present embodiment. FIGS. 7A and 7B are cross-sectional views in the directions perpendicular to each other. In the camera module according to the present modification, engagement between the lens holder 13b and the module board 1 is achieved at the position indicated in FIG. 7B. In the cross-sectional view shown in FIG. 7A rotated by 90 degrees therefrom, the engagement between the lens holder 13b and the module board 1 is not achieved.

In the cross-sectional view shown in FIG. 7A, the surface of the lens holder 13b, which is opposed to the module board 1, has a width substantially equal to the width of the connector 12a and is not formed to extend to he side surface of the connector 12a as a connection part of the connector 12a (where an external lead terminal is formed). In contrast, in the cross-sectional view shown in FIG. 7B, the surface of the lens holder 13, which is opposed to the module board 1, is formed to extend to the side surface of the connector 12a. This part is engaged with the connector 12a with the external terminal of the flexible board 8 set inside. In this manner, mechanical connection is achieved, and it is possible to attain electric connection between the external connection terminal 8b and the spring electrodes 15 of the connector 12a.

As described above, in the camera module according to the present embodiment, only two edges are used for a connection part from the photoelectric conversion module 6 to the module board 1 of the external terminal of the photoelectric conversion module 6, and a structure in which an engagement part with the lens holder 13 is provided is formed at the part of the connector 12a of the other two edges of the connection part. In this manner, down-sizing can be achieved in comparison with the structure which achieves engagement by four edges.

Figure 8:
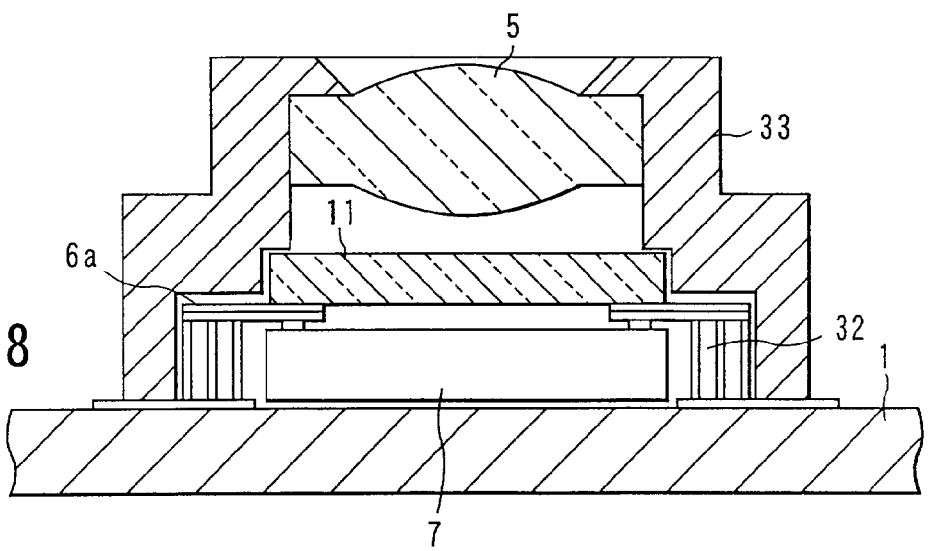
FIG. 8 is an explanatory view of another modification of the first embodiment.

FIG. 8 is a cross-sectional view showing the structure of a camera module according to further another modification of the present embodiment. In the camera module according to the present embodiment, a connector 23 made of conductive rubber is used in place of the connector 12 described above, and a photoelectric conversion module 6a is used in place of the connector 12. The external connection terminal of the photoelectric conversion module 6a is connected to the electrode pattern of the module board 1 through the connector 32.

The connector 32 made of conductive rubber is formed by burying a spring made of brass material or the like subjected to plating processing of nickel and gold, as conductive material, in elastic silicone rubber. It is therefore possible to attain electric conductance with anisotropy by compressive deformation of the silicone rubber and spring.

Although the connector 32 made of conductive rubber has a relatively high connection resistance (about several ten to several hundred mΩ), it enables fine wiring at a pitch of 50 μm and down-sizing to a width of about 1 mm. At the time of connection, a conductive rubber connector 32 is provided between the lens holder 33 and the module board 1, to attain electric connection by a compression force between the lens holder 33 and the module board 1.

Figure 9:
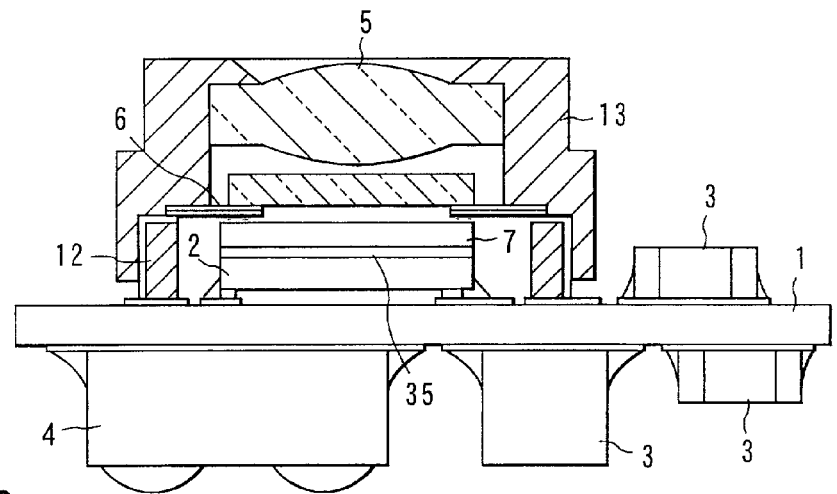
FIG. 9 is a cross-sectional view showing the structure of a camera module according to a second embodiment of the present invention.

FIG. 9 is a cross-sectional view showing the structure of a camera module integrated with a lens, which is incorporated in an image pickup apparatus according to a second embodiment of the present invention. In FIG. 9, the same functional parts as those of FIGS. 1 and 2 will be denoted at the same reference symbols, and detailed explanation thereof will be omitted herefrom.

A signal processing IC 2 is mounted on one surface (front) of the module board 1 by means of flip-chip junction. The connector 12 and the chip components 3 are mounted on that surface of the board 1, too. A rubber sheet 35 covers the upper surface of the signal processing IC 2. A photoelectric transducer element 7 is provided on the rubber sheet 35. The lens holder 13 holds an optical lens 5. The lens holder 13 is fitted into the connector 12. The photoelectric module 6 is thereby clamped between the connector 12 and the lens holder 13. In addition, the lens holder 13 can be connected to the connector 12 while maintaining the optical distance between the optical lens 5 and the photoelectric conversion element 7.

Meanwhile, at a position immediately below the signal processing IC 2 in the other side (back surface side) of the module board 1, a connector 4 for connection to the main board is mounted by soldering. In addition, the chip component 3 is installed at a different position.

In the image pickup apparatus according to the present embodiment, the same advantages as those of the embodiment described above can be obtained, and the signal processing IC 2 and the photoelectric conversion module 6 are constructed in a layered structure through a rubber sheet 35, in the side of the front surface of the module board 1. Therefore, no dead space exists on the back surface of the module board 1, contributing to total down-sizing. In addition, the degree of freedom increases when mounting a connector 4 and chip components 3 on the module board 1. Therefore, the entire apparatus can be formed to be very compact. In addition, the optical lens 13 can be connected to the connector while maintaining the optical distance to the photoelectric conversion element due to compression deformation of the elastic material.

Figure 10:
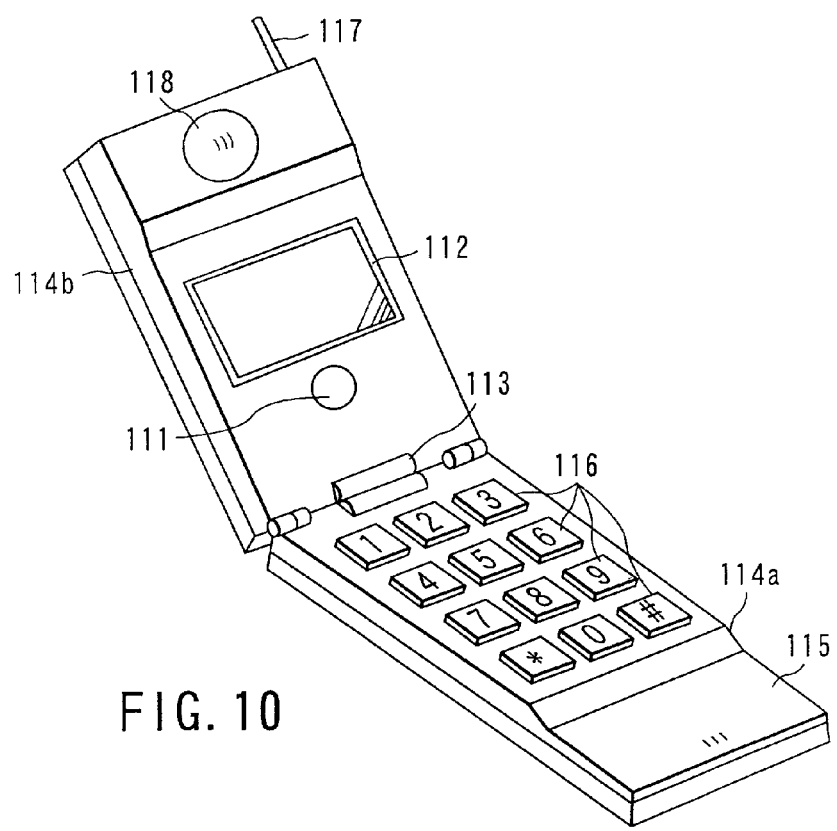
FIG. 10 is a perspective view showing a portable phone according to a third embodiment of the present invention.

FIG. 10 is a perspective view of a portable telephone (portable apparatus) according a third embodiment of this invention. The telephone incorporates an image pickup apparatus according to any one of the embodiments described above.

The portable telephone apparatus according to the present embodiment comprises an image pickup device 111 and a display section 112, as an image transmission function, in addition to a general telephone function based on voices. The portable phone apparatus comprises two cases 114a and 114b which can be opened by a hinge 113. One case 114a is provided with an input microphone 115 and a keyboard 116. In addition, the other case 114b is provided with an antenna 117, a speaker 118, a liquid crystal display section 112, and an image pick up apparatus 111. Any of the image pickup apparatuses explained in the above embodiments is used for the image pickup apparatus 111.

According to this portable phone apparatus, it is possible to pick up an image with excellent image quality by the image pickup apparatus described above. Note that similar advantages can be obtained if an image pickup apparatus (small-size optical part) according to any of the embodiments described above is mounted on a note-type personal computer or the like.

In the image pickup apparatus according to this embodiment, the photoelectric module is not directly connected to the module board. Rather, a connector electrically connects the module to the board. Hence, the apparatus can be manufactured, without performing a heating process on the photoelectric module. The photoelectric module can attain high quality. Additionally, the components can be mounted on the module board at high density, successfully rendering the image pickup apparatus as small as desired. The electric apparatus that incorporates the image pickup apparatus can be have a simple internal structure. If any portable electric apparatus that incorporates the image pickup apparatus can be easily manufactured.

Figure 11A:
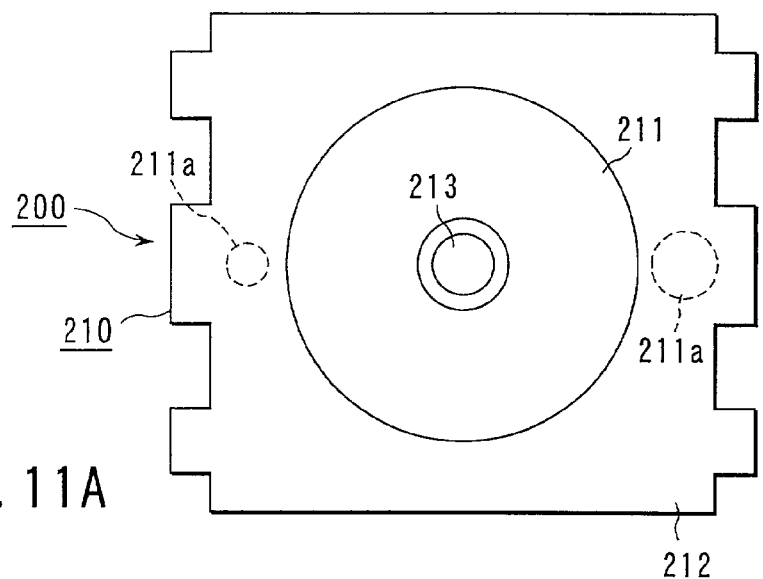
FIGS. 11A and 11B are plan views showing a camera module according to a fourth embodiment of the present invention.
Figure 11B:
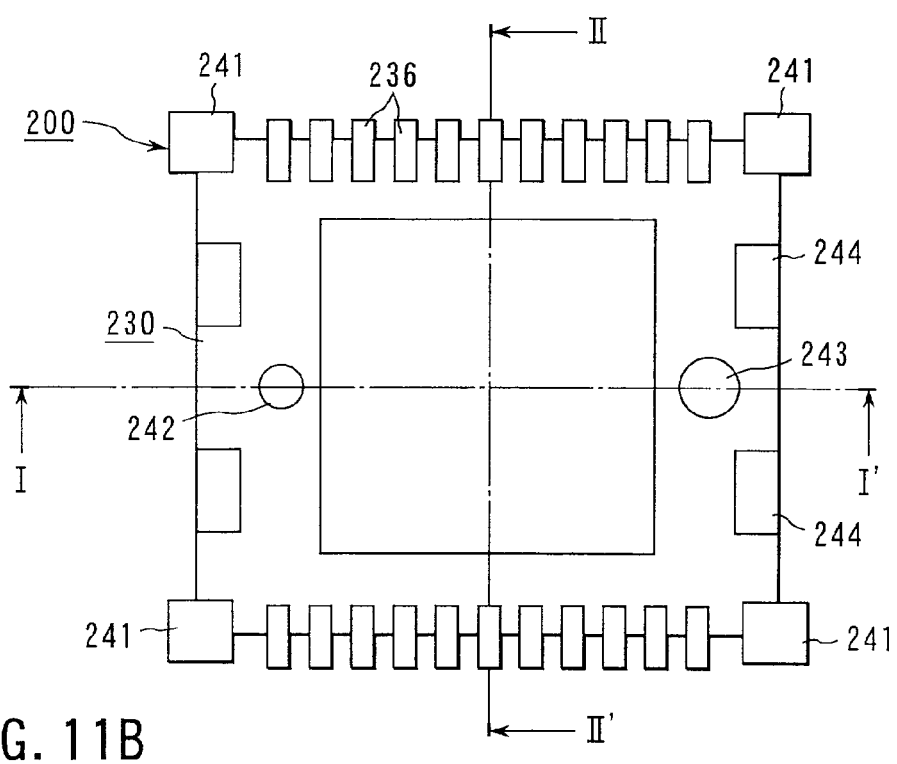
Figure 12A:
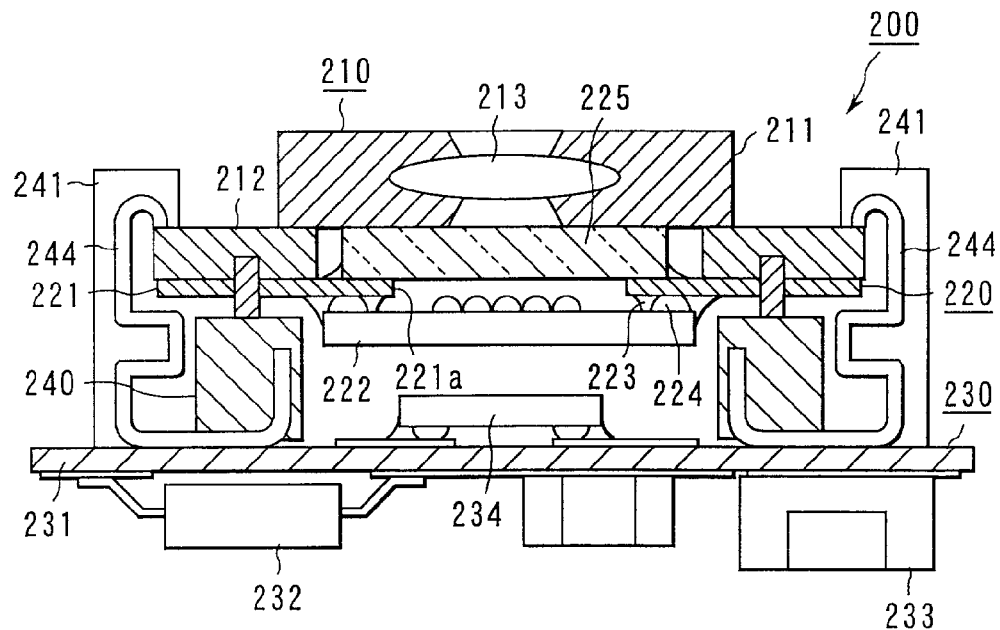
FIGS. 12A and 12B are cross-sectional views showing the camera module.
Figure 12B:
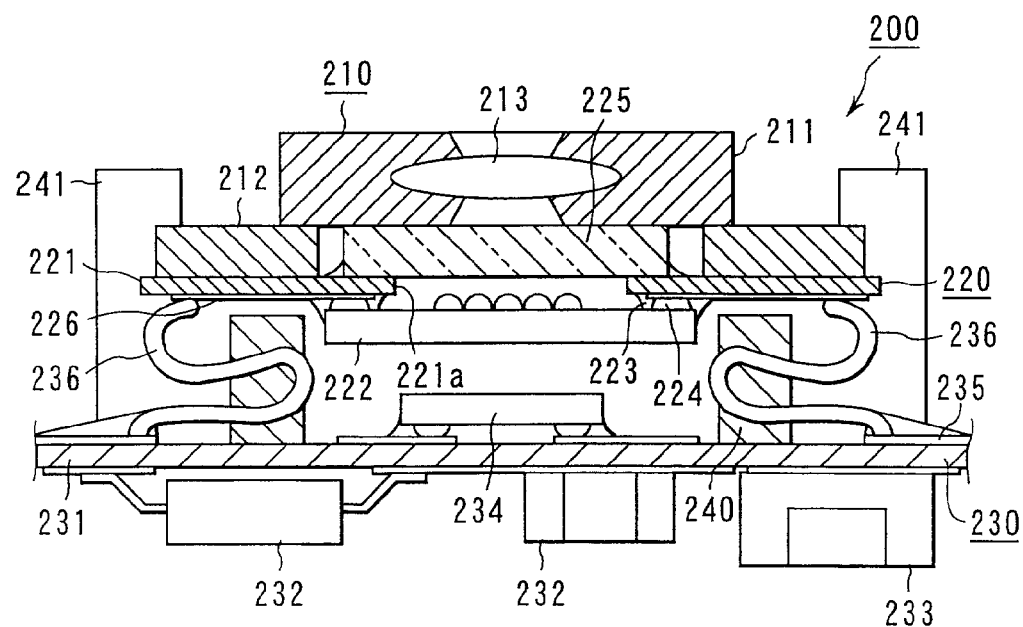

FIGS. 11A and 11B show a camera module 200 integrated with a lens, which is incorporated in the image pickup apparatus according to a fourth embodiment of the present invention. FIG. 11A is a plan view showing a lens holder 210, and FIG. 11B is a plan view showing a connector 240. In addition, FIGS. 12A and 12B are views showing cross-sections of the camera module 200. FIG. 12A is a cross-sectional view cut along the position of the line I-I' in FIG. 11B, observed in the arrow direction. FIG. 12B is a cross-sectional view cut along the line II-II' in FIG. 11B, observed in the arrow direction.

The camera module 200 comprises a lens holder 210, a photoelectric conversion module 220, a module board 230, and a connector 240.

The lens holder 210 comprises a cylindrical lens-barrel part 211 and a plate-like plug part 212 attached to this lens-barrel part 211. An optical lens 213 is attached to the lens-barrel part 211. An opening part is provided in the plug part 212 and is provided on the extended line of the optical axis of the optical lens 213. A flat part in the periphery of this opening is opposed to an area of the flexible board 221 that includes an external connection terminal, and is used for installation of a connector 240 which will be described later. In case where a diaphragm is required for the optical lens 213, the lens holder 210 may be provided with a diaphragm function.

The photoelectric conversion module 220 comprises a flexible board 221. The flexible board 221 is formed of a base board made of polyimide and having a thickness of 25 μm, and a gold-plated copper wire is formed through an adhesive agent layer. On the back surface of the base board, a cover film layer having a thickness of about 200 μm is formed through an adhesive agent layer. So constructed, the flexible board 221 is rigid to some degree, preventing positional changes of the sensor. Note that the material of the flexible board 221 may be polyester, liquid crystal polymer, or the like in place of polyimide and is not limited hitherto.

An opening part 221a is formed at the center of the flexible board 221. In the side of the back surface of the flexible board 221, a bare chip of a photoelectric conversion element 222 such as a CCD, a CMOS sensor, or the like is installed, and the photoelectric conversion part of the photoelectric conversion element 222 is arranged so as to face the opening part 221a. This photoelectric conversion element 222 is mounted by flip chip assembly to the flexible board 221 through a bump (external connection terminal) 224 by an anisotropic conductive adhesive film 223. In addition, in the bump electrode 226 of the flexible board 221, for example, total thirty terminals are arranged in two parallel rows at a pitch of about 0.5 mm.

Optical glass 225 is fixed to the surface of this flexible board 221, by an adhesive agent, so as to face the opening part 221a and oppose to the photoelectric conversion element 222. On the surface of the optical glass 225, there is provided a thin film made of one layer or multiple layers, in correspondence with a required optical characteristic.

Further, an external connection terminal 226 like an electrode pad used for connection to the outside is formed at an outer circumferential part of the flexible board 221 in the side of its back surface.

Since the photoelectric conversion module 220 does not use solder material, the apparatus can be assembled without applying much heat to the photoelectric conversion element 222. It is possible to make junction by flip chip bonding based on ultrasonic junction or by photosensitive resin.

A bump 224 for connection, which is formed on the electrode pad of the photoelectric conversion element 222 is a gold ball having a diameter of several ten to hundred and several ten μm. The bump 224 is provided by electric plating, a wire bonding method, or a transfer method.

The module board 230 comprises, for example, a double-sided wiring board 231 using a glass epoxy board (FR-4) subjected to multi-layer wiring of six layers, a ceramic board, a glass wiring board, or the like. In the side of the back surface of the double-sided wiring board 231, chip components 232 and a connector 233 for external connection are mounted by soldering. In addition, in the side of the front surface of the double-sided wiring board 231, a signal processing IC (DSP) 234 mounted by flip chip bonding, a connection part 235, and spring electrodes 236 soldered to the connection part 235 are provided.

At the position of the module board 230 which surrounds the photoelectric conversion element 222, a connector 240 of a surface mount type is soldered to an electrode on the surface of the module board 230, by reflow soldering, and is thus mechanically fixed thereto.

As shown in FIG. 11B, insertion guide posts 241 are provided respectively at four corners of the connector 240. The connector 240 has two positioning pins 242 and 243 that have different diameters. The positioning pins 242 and 243 are diametrically opposite to each other across the opening. The insertion guide posts 241 for placing the lens holder 210 and the module board 230 at desired positions. The pins 242 and 243 cooperate to prevent the operator to inset the lens holder 210 in a wrong direction.

The connector 240 is provided with a lens holder fixing metal fitting 244 for fixing the lens holder 210, and a part of the fitting is mechanically fixed to the module board 230 by soldering.

The camera module 200 thus constructed is assembled by assembling steps shown in FIGS. 13A to 13E. Note that FIGS. 13A to 13E are cross-sectional views cut along the position II'-I' and observed in the arrow direction.

Figure 13A:
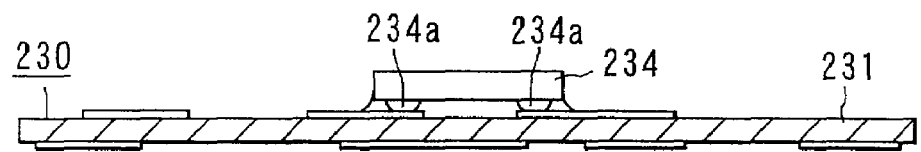
FIGS. 13A to 13E are cross-sectional views showing a step of assembling the camera module.

As shown in FIG. 13A, a signal processing IC 234 and the like are previously mounted by flip chip bonding through an anisotropic conductive adhesive film on the surface of a module board 230. A bump 234a is previously formed at an electrode of the signal processing IC 234. The anisotropic conductive adhesive film may be provided as a paste-like material by pattern-applying it a dispense method, a screen printing method, or the like or by adhering a sheet-like material. The anisotropic adhesive film has been made by kneading metal particles into thermosetting epoxy resin.

The surface where the bump 234a is provided is pressed against the anisotropic conductive adhesive film (for about 10 seconds at 200° C.) to achieve thermocompression bonding. In this manner, the electrodes of the signal processing IC 234 and the module board are connected by the bump 234a, thereby to attain electric connection therebetween. By press-contact using an insulating adhesive film in place of an anisotropic conductive adhesive film, the electrodes of the signal processing IC 234 and the module board 230 may be connected to each other.

Figure 13B:
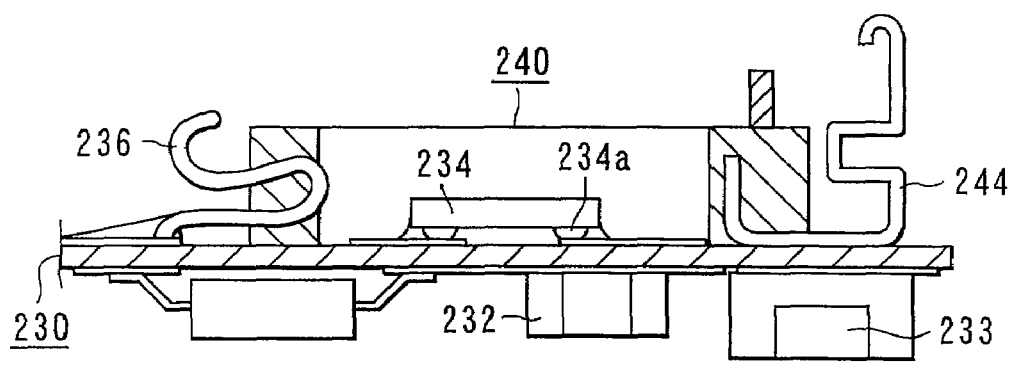

Next, as shown in FIG. 13B, chip components 232 and an external connector 234 are mounted on the backside of the module board 230. As FIG. 13B shows, the connector 240 is fastened to the module board 230 by means of re-flow soldering. The connector 240 surrounds the signal processing IC 234 mounted on the module board 230.

Figure 13C:
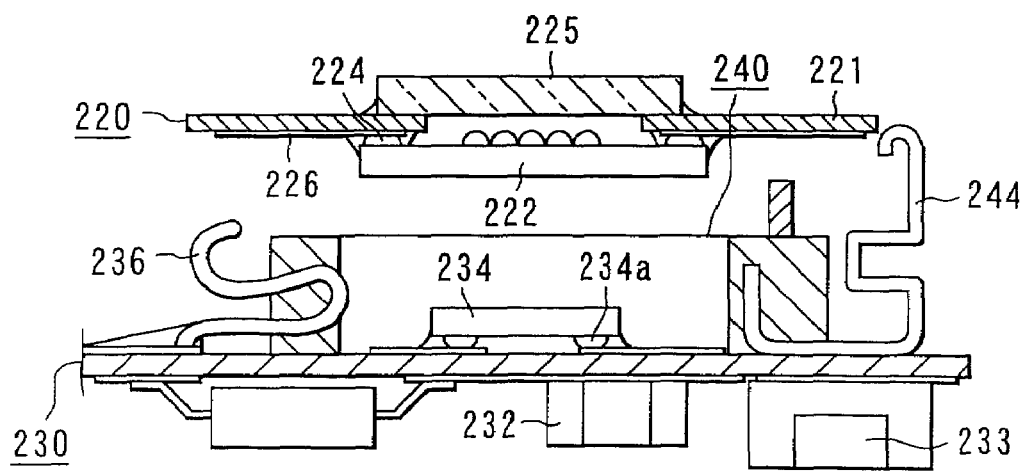

As shown in FIG. 13C, the external connection terminal 226 of the flexible board 221 is arranged above the connector 240 so as to correspond to spring electrodes 236 of the connector 240, with use of positioning pins 242 and 243 and a positioning hole 211a, above the connector 240.

Figure 13D:
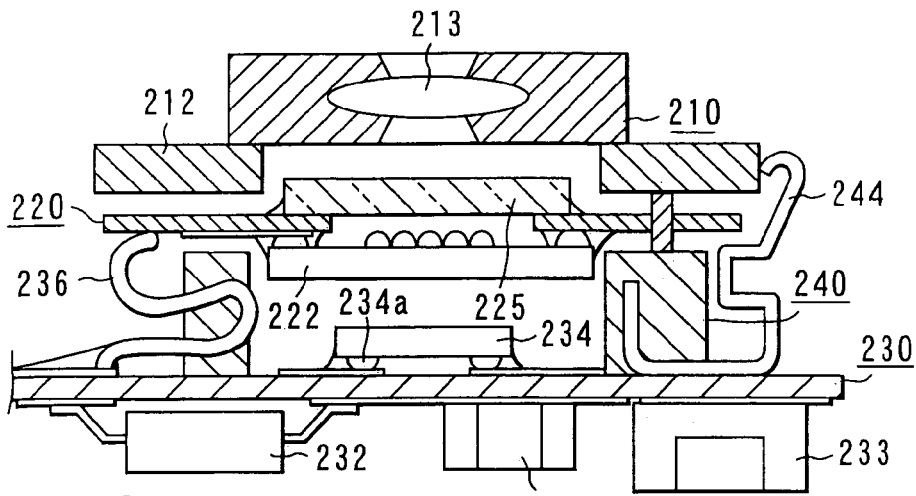

Next, as shown in FIG. 13D, the lens holder 210 which fixes and holds the optical lens 213 is inserted to be pressed against the spring electrodes of the connector 240 through the flexible board 221. At this time, the lens holder fixing metal fitting 244 spreads outward with an elastic force.

Figure 13E:
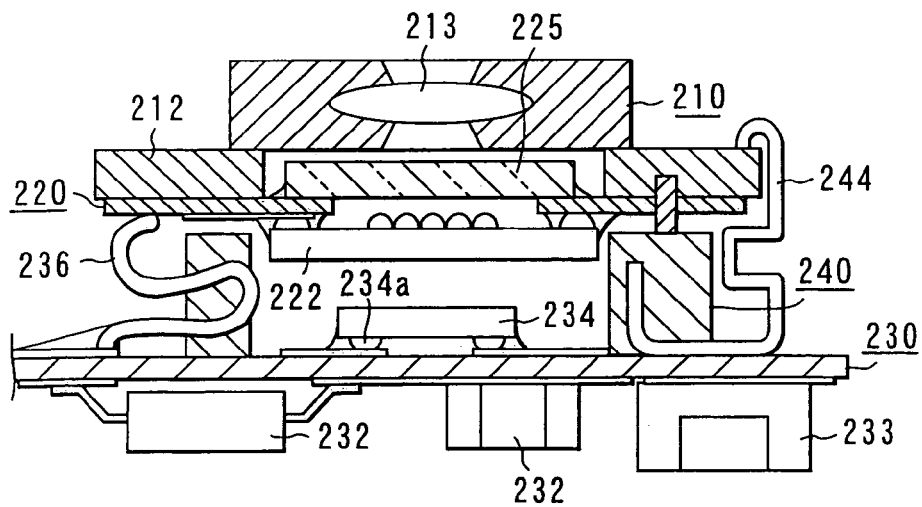
Figure 14:
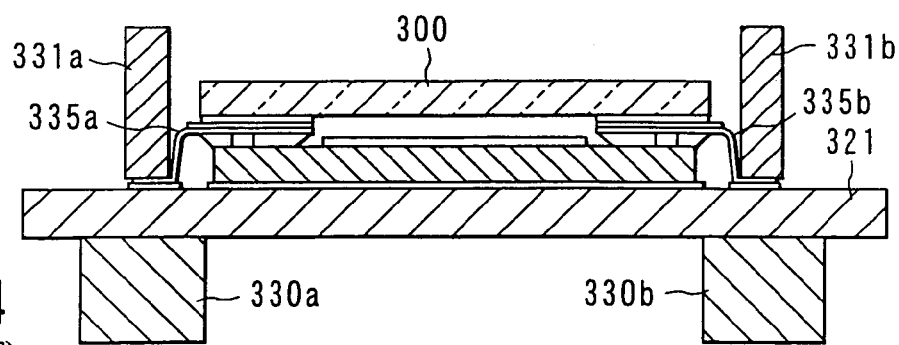
FIG. 14 is an explanatory view of a step of assembling a conventional camera module.

As shown in FIG. 13E, as the plug part 212 of the lens holder 210 is situated below the hook-like shape oriented downward to the inside, the displacement of the lens holder fixing metal fitting 244 returns, and the upward stress transmitted through the flexible board 221 by the spring electrodes 236 is restricted by the hook-like part of the lens holder fixing metal fitting 244 from the upper side.

At this time, the inside of the lens holder 210 is let contact the surface of the optical glass 225 of the photoelectric conversion module 220, the optical lens 213 and the photoelectric conversion element 222 are arranged so as to oppose each other while the optical distance therebetween is maintained at a predetermined value.

The spring electrodes 236 are electrically connected to the electrodes on the surface of the module board 230 by soldering, and at the spring parts, the spring electrodes is pressed into contact with the external connection terminal 226, thereby to attain electric connection.

At this time, a reaction force is received through the external connection terminal 226, and simultaneously, the upper surface of the plug part 212 is held down by the lens holder fixing metal fitting 244. In this manner, the press-contact force between the spring electrodes 236 and the flexible board 221 is ensured so that mechanical and electric connection is maintained.

As has been described above, according to the camera module 200 according to the present embodiment, the photoelectric conversion element 222 can be electrically connected very easily, in a short time, to the module board 230 to which the optical system having a lens, the chip components 232, and the like are reflow-connected, by mechanical press-contact between the plug part 212 of the lens holder 210 and the spring electrodes 236 of the connector 240. It is therefore possible to provide camera modules having a small size with excellent yield.

In addition, since an area where parts can be mounted exists inside the connector 240, a stack structure with the photoelectric conversion element 222 can be constructed by flip chip bonding the signal processing IC 234 at this area. Therefore, there is a high advantage in down-sizing of the module board area.

In addition, stress can be prevented from being concentrated on the lens holder 210 and the lens holder fixing metal fitting 244, by providing the insertion guide posts 241 of the lens holder 210 at four corners of the connector 240 and by further arranging the outer shape thereof in the outside of the lens holder 210 and the lens holder fixing metal fitting 244.

The structure is arranged such that a part of the outer circumference of the lens holder 210 is guided by the insertion guide posts 241 at the four corners when inserting the lens holder 210. In this manner, the mechanism is constructed such that the lens holder can be simply and securely inserted can be even in case where an operator cannot directly observe the positioning pins 242 and 243. Therefore, the productivity can be improved.

Further, the outer sides of the insertion guide posts 241 are arranged outside any of the lens holder 210 and the lens holder fixing metal fitting 244. In this manner, for example, it is possible to avoid at least the stress being concentrated only on the lens holder fixing metal fitting 244 when interference with an external casing occurs at the time of drop impact, and to prevent image quality from being reduced due to a position shift of the optical lens 213.

The image pickup apparatus according to the present embodiment may be incorporated in the portable phone apparatus shown in FIG. 10.

Further, if positioning with higher precision is necessary for the optical distance, a screw structure may be provided for both of a cylindrical bulk to which the optical lens 213 is attached and the lens-barrel of the lens holder, thereby to construct a positioning mechanism.

Of course, the present invention is not limited to the embodiments described above but may be variously modified without deviating from the scope of the present invention.

Additional advantages and modifications will readily occur to those skilled in the art. Therefore, the invention in its broader aspects is not limited to the specific details and representative embodiment shown and described herein. Accordingly, various modifications may be made without departing from the spirit or scope of the general inventive concept as defined by the appended claims and their equivalents.

What is claimed is:

1. An image pickup apparatus comprising:
    a first connector arranged on a wiring board, the first connector being in a shape of a frame having four corners, the first connector having an area to mount electronic components;
    a second connector including an optical lens and being engageable with the first connector;
    a photoelectric conversion module including a photoelectric conversion element which has an electrode located on an optical lens side and on which light from the optical lens is incident, said photoelectric conversion module being fixedly held when the photoelectric conversion module is clamped by the first and second connectors in a state where the first and second connectors are in engagement and coupled relatively to each other;
    positioning members that have at least two different shapes determining relative positions of the first connector, second connector and photoelectric conversion module; and
    a spring electrode electrically connected to a terminal of the photoelectric conversion module and located at a position where the first connector is in contact with the photoelectric conversion module, said spring electrode being electrically connected to the wiring board,
    wherein insertion guide posts used for inserting the second connector are arranged at the four corners of the first connector, and wherein the insertion guide posts protrude outward beyond an outer perimeter of the second connector.

2. An image pickup apparatus according to claim 1, wherein said photoelectric conversion module comprises:
    a second wiring board including an opening;
    the photoelectric conversion element provided for one major surface of the wiring board and including a photoelectric conversion surface that opposes the opening; and
    a transparent member provided for another major surface of the wiring board and covering both the opening and the photoelectric conversion surface.

3. An image pickup apparatus according to claim 1, wherein said second connector includes a lens barrel.

4. An image pickup apparatus according to claim 1, wherein said second connector includes a lens barrel, and said lens barrel has at least one opening which opposes the optical lens and which is provided with a diaphragm.

5. An image pickup apparatus according to claim 1, wherein said insertion guide posts guide the second connector to a predetermined position.

6. An image pickup apparatus according to claim 1, wherein said first connector includes an elastic member which urges the second connector toward the first connector when the first and second connectors are brought into engagement and coupled relatively to each other.

7. A method for manufacturing an image pickup apparatus, comprising:
    an installation step of arranging a first connector and an electronic component on a wiring board and electrically connecting the first connector and the electronic component together, the first connector being in a shape of a frame having four corners, the first connector having an area to mount electronic components; and
    an assembly step performed when the first connector and a second connector are brought into engagement and including:
        inserting a photoelectric conversion module, including a photoelectric conversion element which has an electrode located on an optical lens side and on which light from the optical lens of the second connector is incident, between the first connector and the second connector;
        determining relative positions of the first connector, second connector and photoelectric conversion module by positioning members that have at least two different shapes; and
        electrically connecting a spring electrode located at a position where the first connector is in contact with the photoelectric conversion module to a terminal of the photoelectric conversion module,
    wherein insertion guide posts used for inserting the second connector are arranged at the four corners of the first connector, and wherein the insertion guide posts protrude outward beyond an outer perimeter of the second connector.

8. A portable electric apparatus comprising the image pickup apparatus defined in claim 1.

9. An image pickup apparatus according to claim 1, wherein said positioning members are pins connected to said second connector, and wherein said first connector has opening parts configured to receive said pins.

10. An image pickup apparatus according to claim 9, wherein said photoelectric conversion module has holes configured to allow passage of said pins therethrough.

11. A method of manufacturing an image pickup apparatus according to claim 7, wherein said positioning members are pins connected to said second connector, and wherein said first connector has opening parts configured to receive said pins.

12. A method of manufacturing an image pickup apparatus according to claim 11, wherein said photoelectric conversion module has holes configured to allow passage of said pins therethrough.

* * * * *